(12) United States Patent
Li et al.

(10) Patent No.: US 8,835,758 B2
(45) Date of Patent: Sep. 16, 2014

(54) ELECTRONIC DEVICE WITH CONNECTOR

(75) Inventors: Chien-Yi Li, New Taipei (TW); Yi-Hung Hsieh, New Taipei (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 143 days.

(21) Appl. No.: 13/618,608

(22) Filed: Sep. 14, 2012

(65) Prior Publication Data
US 2013/0162122 A1    Jun. 27, 2013

(30) Foreign Application Priority Data
Dec. 21, 2011    (TW) .................................. 100147641

(51) Int. Cl.
*H05K 5/00* (2006.01)
(52) U.S. Cl.
USPC ................. 174/50; 174/58; 174/60; 439/535; 248/906
(58) Field of Classification Search
USPC ......... 174/50, 58, 60; 439/535, 701; 248/906; 220/4.02
See application file for complete search history.

(56) References Cited

U.S. PATENT DOCUMENTS

| | | | | |
|---|---|---|---|---|
| 7,947,902 B2 * | 5/2011 | Tang | ............................... | 174/50 |
| 7,964,794 B2 * | 6/2011 | Chung | ............................ | 174/58 |
| 8,212,144 B1 * | 7/2012 | Gretz | ............................... | 174/58 |

* cited by examiner

*Primary Examiner* — Dhirubhai R Patel
(74) *Attorney, Agent, or Firm* — Novak Druce Connolly Bove + Quigg LLP

(57) ABSTRACT

An electronic device includes an enclosure body, a mounting apparatus, a securing apparatus, and a connector. The connector defines an engaging hole. The mounting apparatus includes a receiving housing and a first elastic member mounted in the receiving housing. The securing apparatus includes a sliding member mounted to the receiving housing and an engaging member. The engaging member is secured between the receiving housing and the sliding member. The engaging member is engaged in the engaging hole in a first position. The connector is received in the receiving housing and the first elastic member is compressed between the receiving housing and the connector in the first position. The connector moves out of the receiving housing from the first position to a second position when the sliding member slides relative to the receiving housing, to drive the engaging member to disengage from the engaging hole.

20 Claims, 6 Drawing Sheets

ELECTRONIC DEVICE WITH CONNECTOR

BACKGROUND

1. Technical Field

The present disclosure relates to electronic devices, more particularly to an electronic device with a connector.

2. Description of Related Art

The universal serial bus (USB) interface, which has Plug 'n Play (PNP), hot insertion/hot swapping and other functions, is a very popular data transmission interface applied to peripheral devices. A conventional electronic device includes a plurality of USB interfaces arranged in a line. However, a USB device being connected to one USB interface of the electronic device may prevent the adjacent USB interface from being used by another USB device. Therefore, there is room for improvement in the art.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean "at least one."

Figure 1:
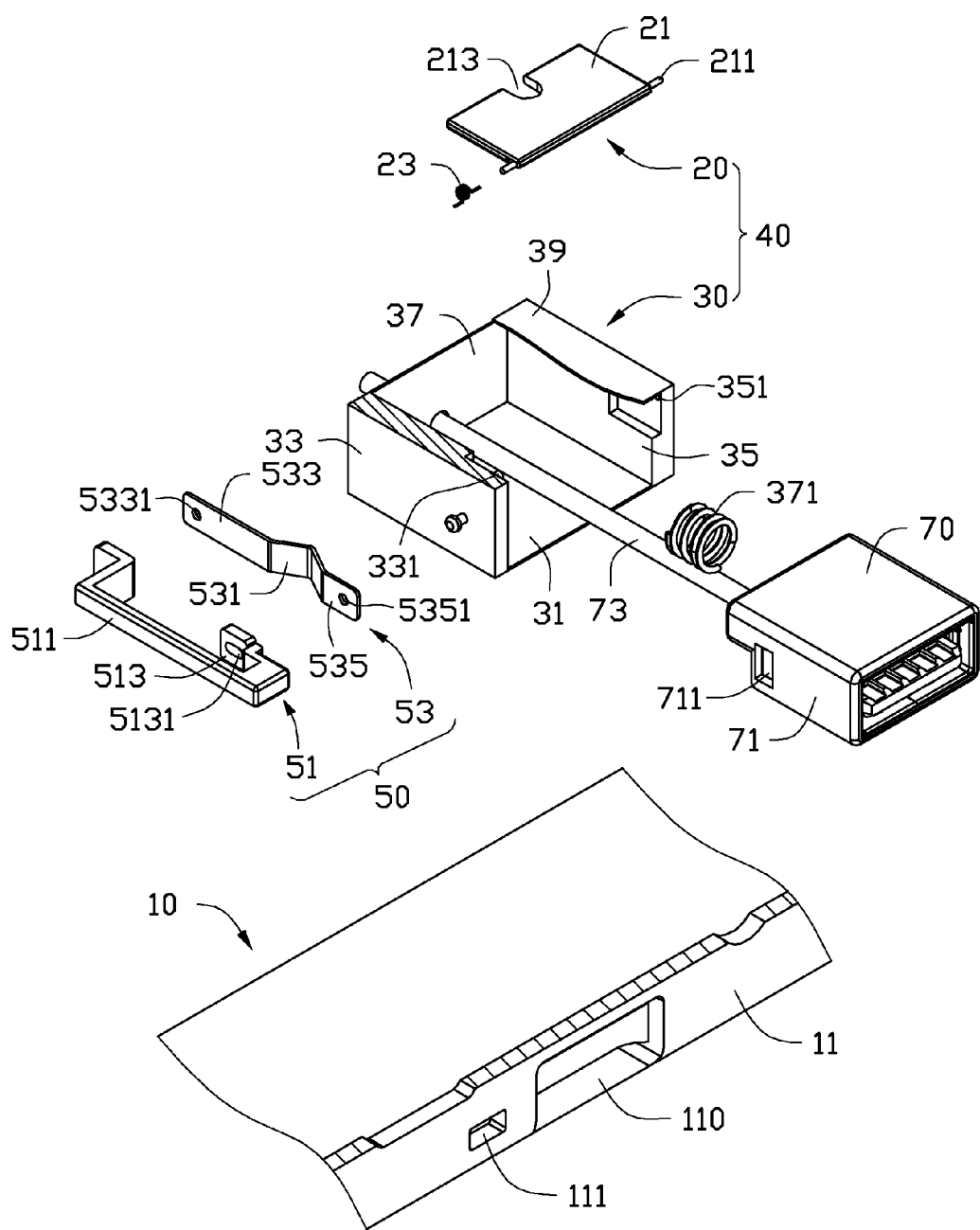
FIG. 1 is an exploded, isometric view of an electronic device in accordance with an embodiment.
Figure 2:
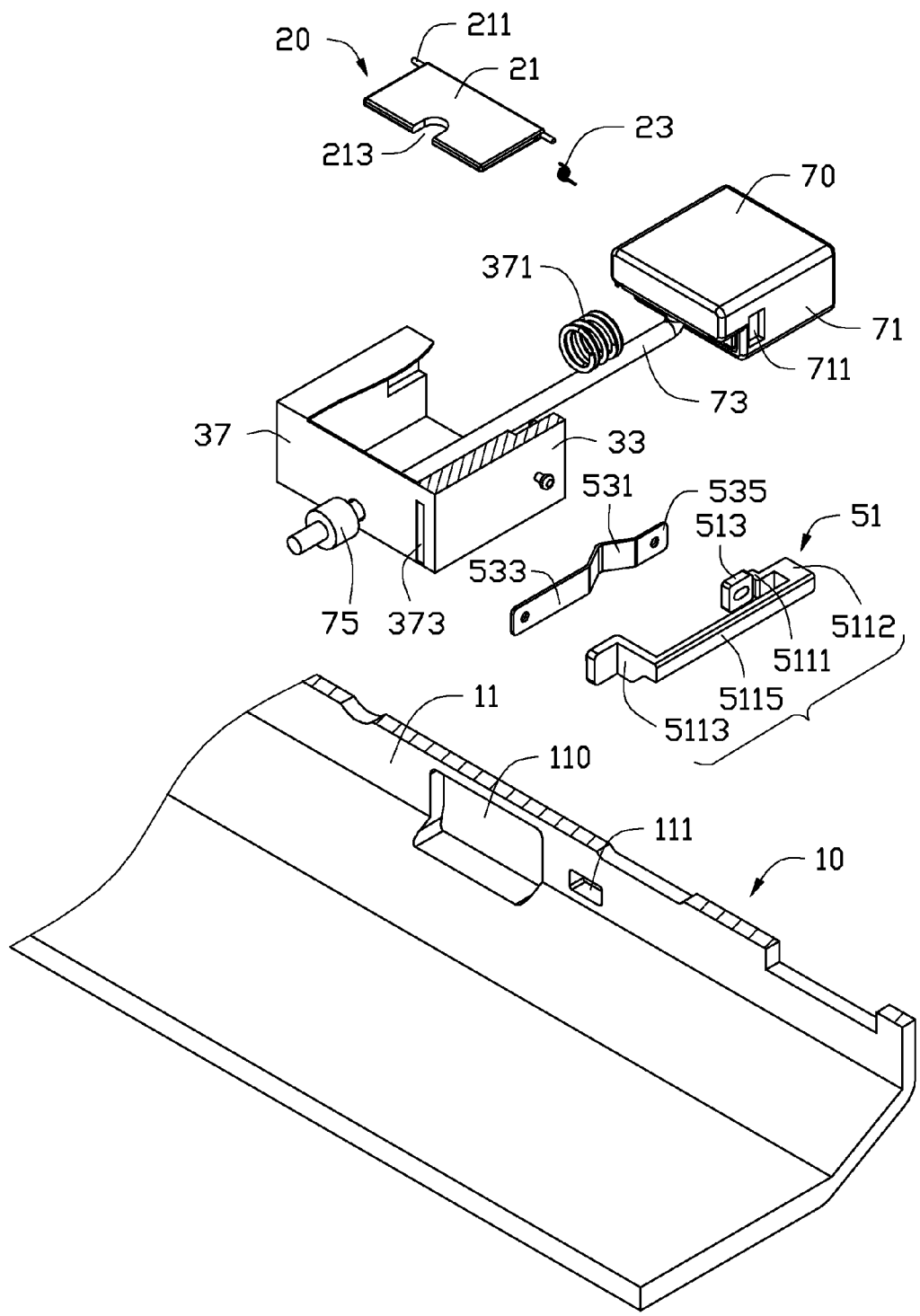
FIG. 2 is similar to FIG. 1, but the device is viewed from another aspect.

Referring to FIGS. 1 and 2, an electronic device enclosure in accordance with an embodiment is shown. The electronic device includes an enclosure body 10, a mounting apparatus 40, a securing apparatus 50, and a connector 70 mounted to the mounting apparatus 40. In one embodiment, the connector 70 is a USB connector.

The enclosure body 10 includes a side wall 11. The side wall 11 defines a mounting opening 110 and a mounting hole 111 adjacent to the mounting opening 110.

The mounting apparatus 40 includes a receiving housing 30 and a cover panel 20. The receiving housing 30 includes a bottom panel 31, a first side panel 33, a second side panel 35 extending from opposite sides of the bottom panel 31, a rear panel 37, and a top panel 39. The rear panel 37 and the top panel 39 are connected between the first and second side panels 33 and 35. The rear panel 37 is substantially perpendicular to the bottom panel 31. The top panel 39 is substantially parallel to the bottom panel 31. The first side panel 33 and the second side panel 35 are substantially perpendicular to the bottom panel 31. A first elastic member 371 is mounted to the rear panel 37. In one embodiment, the first elastic member 371 is a coil spring. The rear panel 37 further defines a mounting slot 373 (shown in FIG. 2). The first side panel 33 includes a first positioning post 331. The second side panel 35 includes a second positioning post 351.

The cover panel 20 includes a panel body 21 and two pivot posts 211 extending from opposite sides of the panel body 21. The panel body 21 defines a cutout 213. A second elastic member 23 is used as a constant-torque source around one pivot post 211.

The securing apparatus 50 includes a sliding member 51 and an engaging member 53 mounted to the sliding member 51. The sliding member 51 includes a connecting arm 511 and a sliding portion 513 extending from the connecting arm 511. The connecting arm 511 includes a first bent portion 5111, a pressing portion 5112 extending from the first bent portion 5111, a second bent portion 5113, and a connecting portion 5115 connected to the pressing portion 5112 and the second bent portion 5113. The first bent portion 5111 and the second bent portion 5113 are both L-shaped. The sliding portion 513 defines an elongated hole 5131. The sliding portion 513 is substantially parallel to the first side panel 33.

The engaging member 53 includes an elastic engaging portion 531, a pulling portion 533 extending from the elastic engaging portion 531, and a securing portion 535 extending from the engaging portion 531. In one embodiment, the elastic engaging portion 531 is V-shaped. The pulling portion 533 defines a securing hole 5351 for securing the pulling portion 533 to the distal end of the second bent portion 5113.

The connector 70 includes a side surface 71 which defines an engaging hole 711 corresponding to the elastic engaging portion 531. The side surface 71 is substantially parallel to the first side panel 33. A cable 73 is connected to the connector 70 and a stopper portion 75 is mounted to the cable 73.

Figure 3:
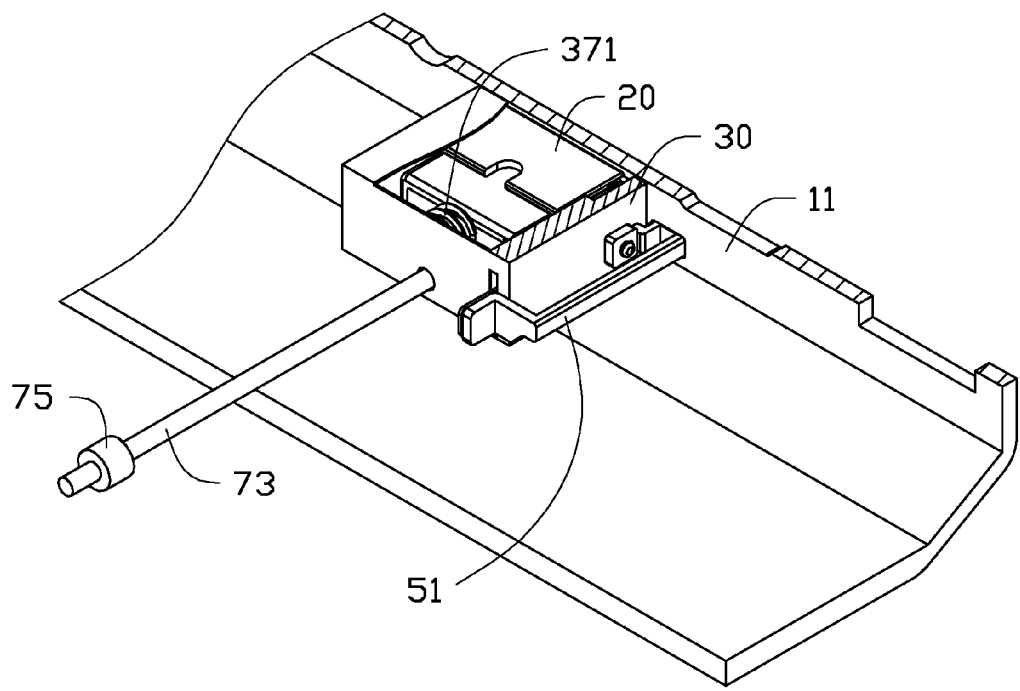
FIG. 3 is an assembled view of the device of FIG. 1.
Figure 4:
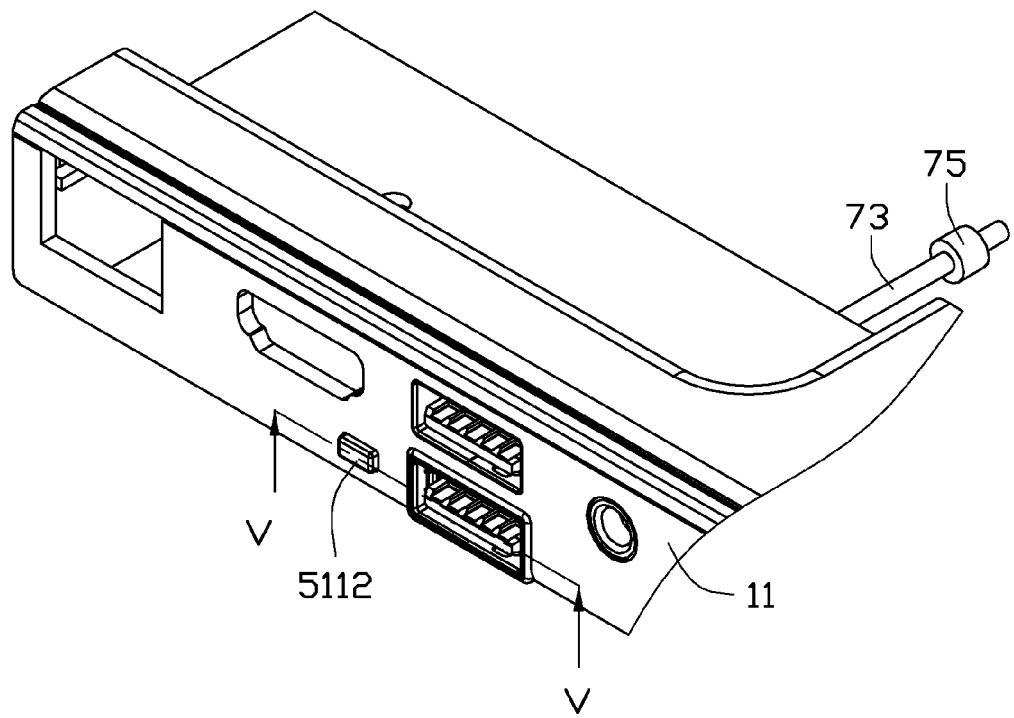
FIG. 4 is similar to FIG. 3, but the device is viewed from another aspect.
Figure 5:
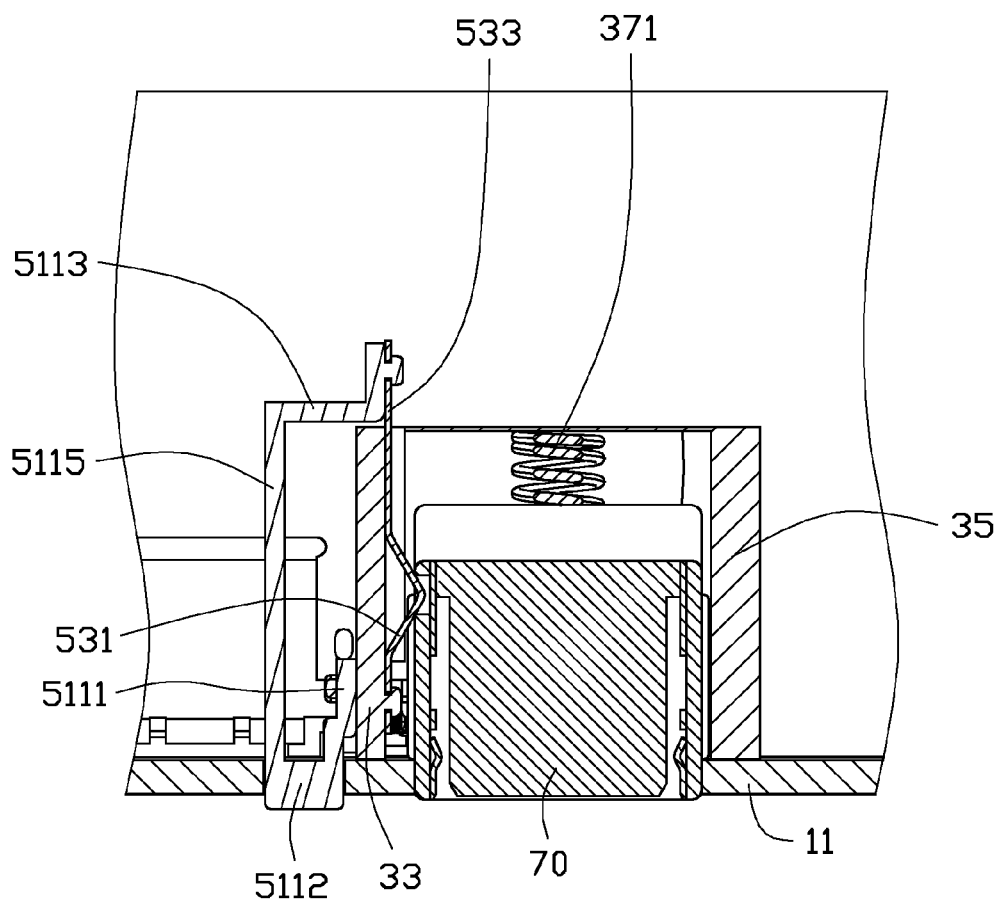
FIG. 5 is a cross-section view of FIG. 3 taken along a line V-V.
Figure 6:
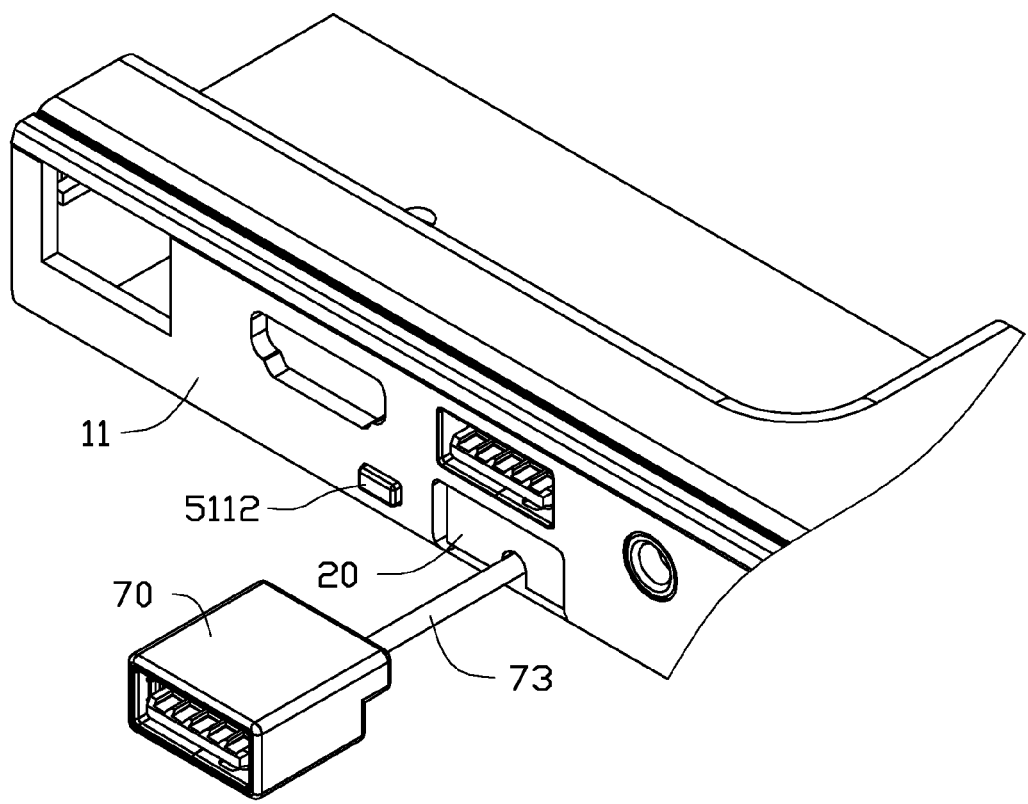
FIG. 6 is an assembled view of the device of FIG. 1, which shows the connector moving out of the receiving housing of FIG. 1.

Referring to FIGS. 3 to 5, in assembly, the second elastic member 23 is placed, under tension, around the one of the pivot posts 211 of the cover panel 20. The two pivot posts 211 are pivotally received in the first positioning post 331 and the second positioning post 351. The engaging member 53 is placed in the receiving housing 30. The pulling portion 533 extends through the mounting slot 373. The distal end of the second bent portion 5113 and the pulling portion 533 of the engaging member 53 are secured together via a fastener (not labeled). The securing portion 535 is secured to the inner surface of the first side panel 33 via a fastener (not labeled). A fastener (not labeled) extends in the elongated hole 5131 to mount the sliding portion 513 to the outer surface of the first side panel 33. The cable 73 extends through the rear panel 37 and can be moved relative to the rear panel 37. The stopper portion 75 is mounted to the cable 73 and placed on the outside of the rear panel 37. The first elastic member 371 is placed inside of the rear panel 37. The connector 70 moves to the receiving housing 30 to be received in the receiving housing 30 and the elastic engaging portion 531 engages in the engaging hole 711. At this time, the first elastic member 371 is resiliently compressed between the connector 70 and the rear panel 37. The receiving housing 30 is received in the mounting opening 110, and the pressing portion 5112 of the sliding member 51 is received in the mounting hole 111.

In use, the pressing portion 5112 of the sliding member 51 is pressed toward the side wall 11 to drive the second bent portion 5113 to pull the pulling portion 533 of the engaging member 53 inward. The elastic engaging portion 531 is deformed to enable the engaging portion 531 to disengage from the engaging hole 711. The first elastic member 371 decompresses to push the connector 70 to move away from the receiving housing 30. At this time, the cover panel 20 rotates to cover the receiving housing 30, and the cable 73 is thus received in the cutout 213 of the cover panel 20.

It is to be understood, however, that even though numerous characteristics and advantages have been set forth in the foregoing description of embodiments, together with details of the structures and functions of the embodiments, the disclosure is illustrative only and changes may be made in detail, especially in the matters of shape, size, and arrangement of parts within the principles of the disclosure to the full extent indicated by the broad general meaning of the terms in which the appended claims are expressed.

What is claimed is:

1. An electronic device comprising:
    an enclosure body; a mounting apparatus mounted in the enclosure body, the mounting apparatus comprising a receiving housing and a first elastic member mounted to the receiving housing; a securing apparatus mounted in the enclosure body, the securing apparatus comprising a sliding member and an engaging member, the sliding member is slidably mounted to the receiving housing, and the engaging member is secured between the receiving housing and the sliding member; a connector defines an engaging hole;
    wherein the engaging member is engaged in the engaging hole in a first position; the connector is received in the receiving housing in the first position, and the first elastic member is compressed between a rear panel of the receiving housing and the connector in the first position; and the connector is moveable out of the receiving housing by the first elastic member from the first position to a second position when the sliding member slides relative to the receiving housing to drive the engaging member to disengage from the engaging hole in the first position.

2. The electronic device of claim 1, wherein the receiving housing comprises a first side panel; the engaging member is mounted to an inner side of the first side panel; and the sliding member is slidably mounted to an outer side of the first side panel.

3. The electronic device of claim 2, wherein the engaging member comprises an elastic engaging portion; the elastic engaging portion is engaged in the engaging hole; the sliding member is configured to slide relative to the first side panel and deform the elastic engaging portion, thereby the elastic engaging portion disengages from the engaging hole.

4. The electronic device of claim 3, wherein the elastic engaging portion is substantially V-shaped.

5. The electronic device of claim 2, wherein the rear panel is substantially perpendicular to the first side panel; the rear panel defines a mounting slot that receives the engaging member; and the sliding member is secured to the engaging member and located out of the receiving housing.

6. The electronic device of claim 1, wherein the sliding member comprises a connecting arm and a sliding portion extending from the connecting arm; the sliding portion defines an elongated hole; a fastener is secured to the receiving housing via the elongated hole; and the connecting arm is slidable relative to the receiving housing.

7. The electronic device of claim 6, wherein the connecting arm comprises a first bent portion extending from the sliding portion and a pressing portion extending from the first bent portion, and the enclosure body defines a mounting hole receiving the pressing portion.

8. The electronic device of claim 7, wherein the connecting arm further comprises a connecting portion extending from the pressing portion and a second bent portion extending from the connecting portion, and the second bent portion is secured to the engaging member.

9. The electronic device of claim 1, wherein the mounting apparatus further comprises a cover panel pivotally mounted to the receiving housing; and the cover panel covers the receiving housing when the connector is in the second position.

10. The electronic device of claim 9, wherein the mounting apparatus further comprises a second elastic member; the cover panel comprises a pivot post; the second elastic member is coiled around the pivot post; and the second elastic member biases to drive the cover panel to rotate to cover the receiving housing when the connector is in the second position.

11. An electronic device comprising: an enclosure body, the enclosure body comprising a side wall, the side wall defining a mounting opening and a mounting hole; a mounting apparatus, the mounting apparatus comprising a receiving housing received in the mounting opening and a first elastic member mounted to the receiving housing; a securing apparatus, the securing apparatus comprising a sliding member and an engaging member; the sliding member slidably mounted to the receiving housing; the engaging member secured between the receiving housing and the sliding member; and the sliding member received in the mounting hole; a connector received in the receiving housing; wherein the engaging member engages the connector in a first position; the first elastic member is compressed between a rear panel of the receiving housing and the connector in the first position; and the connector is movable out of the receiving housing from the first position by the first elastic member to a second position when the sliding member is pressed inside via the mounting hole to slide relative to the receiving housing to drive the engaging member to disengage from the connector.

12. The electronic device of claim 11, wherein the receiving housing comprises a first side panel; the engaging member is mounted to an inner side of the first side panel; and the sliding member is slidably mounted to an outer side of the first side panel.

13. The electronic device of claim 12, wherein the engaging member comprises an elastic engaging portion; the connector defines an engaging hole; the elastic engaging portion is engaged in the engaging hole; the sliding member is configured to slide relative to the first side panel and deform the elastic engaging portion, thereby disengaging from the engaging hole.

14. The electronic device of claim 13, wherein the elastic engaging portion is substantially V-shaped.

15. The electronic device of claim 12, wherein the rear panel is substantially perpendicular to the first side panel; the rear panel defines a mounting slot that receives the engaging member; and the sliding member is secured to the engaging member located out of the receiving housing.

16. The electronic device of claim 11, wherein the sliding member comprises a connecting arm and a sliding portion extending from the connecting arm; the sliding portion defines an elongated hole; a fastener is secured to the receiving housing via the elongated hole; and the connecting arm is slidable relative to the receiving housing.

17. The electronic device of claim 16, wherein the connecting arm comprises a first bent portion extending from the sliding portion and a pressing portion extending from the first bent portion, and the pressing portion is received in the mounting hole.

18. The electronic device of claim 17, wherein the connecting arm further comprises a connecting portion extending from the pressing portion and a second bent portion extending from the connecting portion, and the second bent portion is secured to the engaging member.

19. The electronic device of claim 11, wherein the mounting apparatus further comprises a cover panel pivotally mounted to the receiving housing; the cover panel covers the receiving housing when the connector is in the second position.

20. The electronic device of claim 19, wherein the mounting apparatus further comprises a second elastic member; the cover panel comprises a pivot post; the second elastic member is coiled around the pivot post; and the second elastic member biases to drive the cover panel to rotate to cover the receiving housing when the connector is in the second position.

* * * * *